(12) United States Patent
Garcia et al.

(10) Patent No.: US 8,072,278 B2
(45) Date of Patent: Dec. 6, 2011

(54) SYSTEM AND METHOD FOR REDUCING POWER CONSUMPTION OF AN OSCILLATOR

(75) Inventors: Jorge A. Garcia, San Diego, CA (US); Todd Moyer, Yachats, OR (US)

(73) Assignee: QUALCOMM Incorporated, San Diego, CA (US)

( * ) Notice: Subject to any disclaimer, the term of this patent is extended or adjusted under 35 U.S.C. 154(b) by 140 days.

(21) Appl. No.: 12/467,894

(22) Filed: May 18, 2009

(65) Prior Publication Data

US 2010/0289587 A1 Nov. 18, 2010

(51) Int. Cl.
*H03B 5/32* (2006.01)

(52) U.S. Cl. .............. 331/158; 331/107 R; 331/116 R; 331/116 FE; 331/154; 331/160

(58) Field of Classification Search .............. 331/107 R, 331/115, 116 R, 116 FE, 117 FE, 154, 158, 331/160, 177 R
See application file for complete search history.

(56) References Cited

U.S. PATENT DOCUMENTS

| | | | |
|---|---|---|---|
| 4,346,537 A | 8/1982 | Masujima et al. | |
| 4,956,618 A * | 9/1990 | Ulmer | 331/116 FE |
| 2002/0125963 A1* | 9/2002 | Ash | 331/107 A |
| 2004/0233000 A1 | 11/2004 | Stevenson et al. | |
| 2005/0059375 A1 | 3/2005 | Abe et al. | |
| 2007/0021087 A1 | 1/2007 | Turner | |
| 2008/0100392 A1 | 5/2008 | Pernia et al. | |
| 2009/0080568 A1 | 3/2009 | Lee et al. | |

FOREIGN PATENT DOCUMENTS

| | | |
|---|---|---|
| CH | 607669 A | 10/1978 |
| DE | 1591524 | 1/1970 |
| GB | 2430752 A | 4/2007 |
| JP | 54067471 A | 5/1979 |
| JP | 11308050 | 11/1999 |

OTHER PUBLICATIONS

Partial International Search Report—PCT/US2010/033681, International Searching Authority, European Patent Office, Aug. 10, 2010.
International Search Report and Written Opinion—PCT/US2010/033681, International Search Authority—European Patent Office—Jan. 21, 2011.
Trimming the Crystal Frequency in: Robert Matthys: "Crystal Oscillator Circuits", 1992, Krieger Publishing Company, Malabar, Florida, XP002614715, ISBN: 0-89464-552-8 pp. 101-102.

* cited by examiner

*Primary Examiner* — Joseph Chang
*Assistant Examiner* — Jeffrey Shin
(74) *Attorney, Agent, or Firm* — Dang M. Vo

(57) ABSTRACT

An apparatus for generating an oscillating signal including a negative-resistance circuit, a crystal, and a component to modify a series resonance of the crystal to decrease power consumption of the negative-resistance circuit in generating the oscillating signal. The component may include a positive-reactance circuit, one or more inductive elements, or pair of inductive elements coupled to the crystal. The apparatus may further include a frequency-tuning component for adjusting a frequency of the oscillating signal, such as a variable capacitor coupled to the crystal. The negative-resistance circuit may include a digital inverter circuit, an inverting analog amplifier, or a self-regulating circuit. The apparatus may further include a quiescent current source to supply a steady-state current to the negative-resistance circuit, and a start up current source to supply a boost current to the negative-resistance circuit only during start up to expedite the oscillating signal in reaching a defined steady-state condition.

34 Claims, 8 Drawing Sheets

SYSTEM AND METHOD FOR REDUCING POWER CONSUMPTION OF AN OSCILLATOR

FIELD

The present disclosure relates generally to communication systems, and more specifically, to a system and method for reducing power consumption of an oscillator.

BACKGROUND

In many communication systems, an oscillator is employed to generate a reference oscillating signal from which other signals and/or clocks are produced. For example, the reference oscillating signal may be used to generate one or more clocks for driving digital and analog circuitry. Additionally, the reference oscillating signal may be employed in a local oscillator (LO) for downconverting radio frequency (RF), intermediate frequency (IF), or other signals to lower or baseband frequencies, and/or for upconverting baseband signals to IF, RF, or other higher frequencies.

Many of these communication systems are portable systems, such as cellular telephones, personal digital assistants (PDAs), handheld devices, and other portable communication devices. These portable communication systems typically rely on a limited power source, such as a battery, to perform the various intended operations. A limited power source typically has a continuous use lifetime that depends on the amount of power drawn by the portable device. It is generally desired to extend the continuous use lifetime as much as possible. Accordingly, portable communication systems are more frequently designed to consume less and less power.

With regard to oscillators, their power consumption generally depends on the frequency tuning range of the oscillating signal being generated. For example, if an oscillator is designed using a very expensive and precise crystal (Xtal), the frequency tuning range need not be that large. Consequently, the power consumption of the oscillator may be maintained relatively low. On the other hand, if an oscillator is designed using an inexpensive and not-so-precise Xtal, the frequency tuning range generally needs to be larger in order to ensure that the frequency of the oscillating signal is maintained within specification. Unfortunately, the power consumption of the oscillator is generally greater with the wider frequency tuning range. This is better explained with reference to the following example.

FIG. 1A illustrates a block/schematic diagram of a conventional apparatus 100 for generating an oscillating signal. The conventional apparatus 100 typically comprises a negative resistance circuit 102 and a resonator coupled in a feedback configuration with the negative resistance circuit. The resonator, in this example, includes a Xtal 104 and a pair of variable capacitors $C_P$, typically referred to in the relevant art as Pierce capacitors. The variable capacitors $C_P$ serve to provide external tuning of the frequency of the oscillating signal generated by the apparatus 100.

FIG. 1B illustrates a graph of an impedance versus frequency of the resonator of the conventional apparatus 100. If, for example, the Pierce capacitors $C_P$ of the conventional oscillator 100 are removed, the frequency of the oscillating signal is dictated substantially by the Xtal 104. In such a case, the frequency of the oscillating signal falls substantially on the parallel resonance of the Xtal 104, as indicated in the graph. At the parallel resonance, the power drawn by the negative resistance circuit 102 is substantially minimized because the impedance of the resonator is substantially maximized.

If the Xtal 104 is very precise from lot-to-lot, the parallel resonance for the Xtal does not significantly change from lot-to-lot. If the tolerance of the parallel resonance is within the frequency deviation specification of the oscillator 100, then the Pierce capacitors $C_P$ need not be required, and the oscillator may be operated in a power efficient manner. However, such a precise Xtal 104 is typically very expensive. Thus, in order to reduce cost of the oscillator 100, a less precise and cheaper Xtal 104 may be employed. This may have the adverse consequence of the parallel resonance of the Xtal 104 from lot-to-lot varying more than the frequency deviation specification of the oscillator 100. In such a case, frequency tuning may be required, thereby, mandating the use of one or more variable capacitors $C_P$.

The effects of adding capacitance $C_P$ to the resonator of the oscillator 100 is to decrease the frequency of the oscillating signal. This has the consequence of lowering the impedance of the resonator from the impedance associated with the parallel resonance of the Xtal 104 towards the impedance associated with the series resonance of the Xtal, as indicated by the oscillator tunable range in the graph. As the impedance of the resonator moves closer to the series resonance of the Xtal 104, the negative resistance circuit 102 consumes more power.

The power consumption is related to the pullability or frequency difference between the parallel resonance and the series resonance of the Xtal 104. For a given frequency of the oscillating signal, the power consumption of the oscillator 100 is less if the pullability is larger. Or, conversely, for a given frequency of the oscillating signal, the power consumption of the oscillator 100 is more if the pullability is smaller. Thus, there is a need to increase the pullability of the oscillator 100 in order to operate the oscillator 100 in a more power efficient manner.

SUMMARY

An aspect of the disclosure relates to an apparatus for generating an oscillating signal comprising a negative-resistance circuit, a crystal, and a component adapted to modify a series resonance of the crystal to decrease power consumption of the negative-resistance circuit in generating the oscillating signal. In another aspect, the component comprises a positive-reactance circuit. In yet another aspect, the component comprises one or more inductive elements. In still another aspect, the component comprises a pair of inductive elements coupled respectively to both sides of the crystal.

In another aspect of the disclosure, the apparatus for generating an oscillating signal further comprises a frequency-tuning component for adjusting the frequency of the oscillating signal. In yet another aspect, the frequency-tuning component is adapted to adjust the frequency of the oscillating signal to be within ±10 parts-per-million (ppm) of a defined frequency. In still another aspect, the frequency-tuning component comprises one or more variable capacitive elements coupled to the crystal.

In another aspect of the disclosure, the negative-resistance circuit is configured to consume less current for a given capacitance of the one or more variable capacitive elements. In yet another aspect, the negative-resistance circuit is configured to consume less power for a given capacitance of the one or more variable capacitive elements. In still another aspect, the negative-resistance circuit comprises a digital inverter circuit, an inverting analog amplifier, or a self-regulating circuit. In even still another aspect, the apparatus for generating an oscillating signal comprises a quiescent current source adapted to supply a substantially steady-state current to a negative-resistance circuit, and a start up current source adapted to supply a boost current to the negative-resistance circuit only during an initiation of the oscillating signal to expedite the oscillating signal in reaching a predefined steady-state condition from a cold start.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Figure 1A:
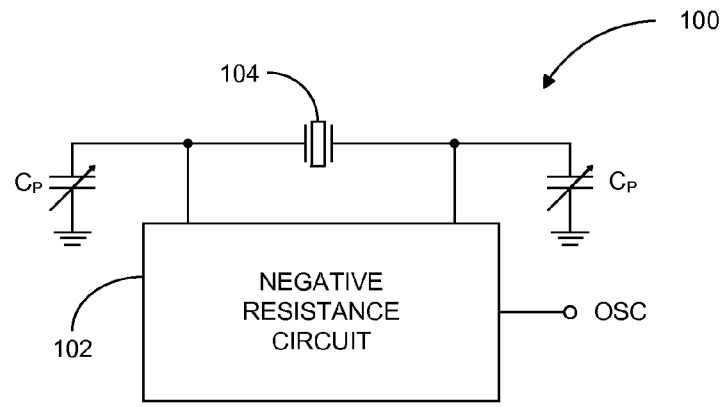
FIG. 1A illustrates a block/schematic diagram of a conventional apparatus for generating an oscillating signal.
Figure 1B:
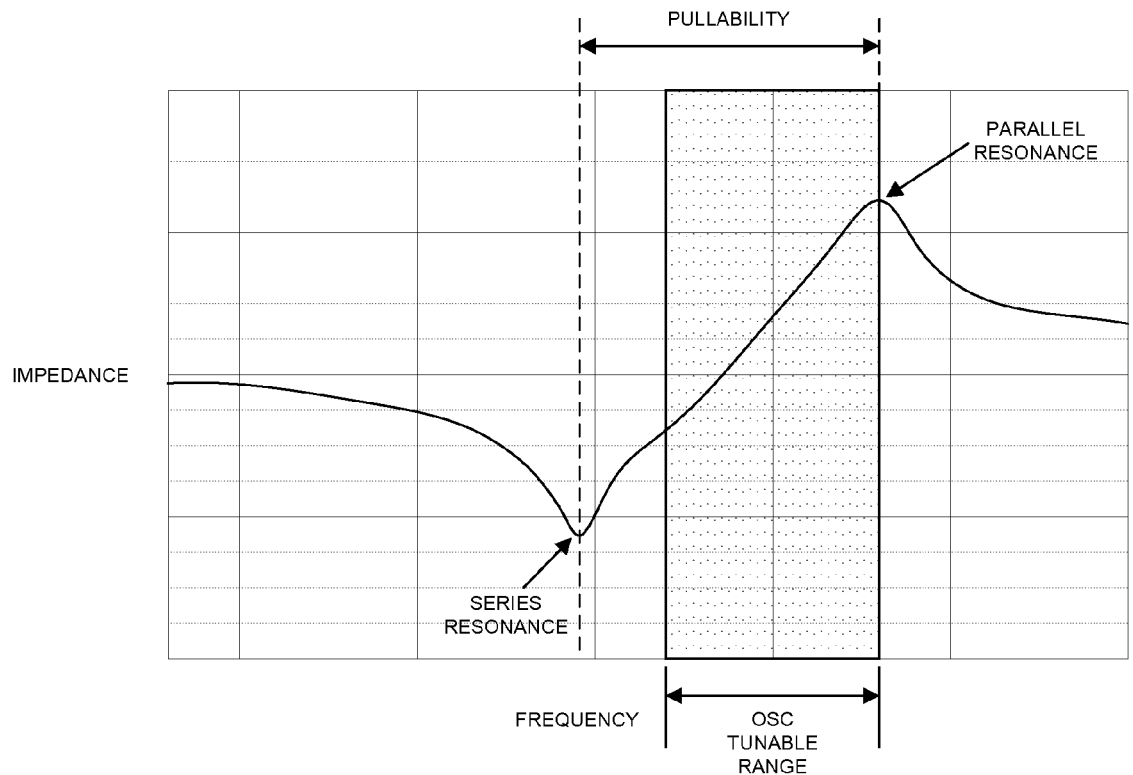
FIG. 1B illustrates a graph of an impedance versus frequency of a resonator of the conventional apparatus for generating an oscillating signal.
Figure 2A:
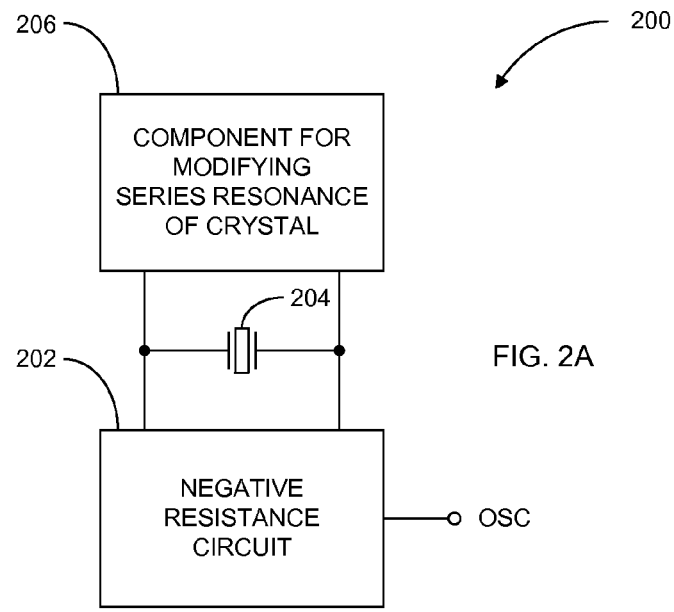
FIG. 2A illustrates a block/schematic diagram of an exemplary apparatus for generating an oscillating signal in accordance with an aspect of the disclosure.

FIG. 2A illustrates a block/schematic diagram of another exemplary apparatus 200 for generating an oscillating signal in accordance with another aspect of the disclosure. In summary, the apparatus 200 includes a component for lowering the series resonance of the Xtal without significantly affecting the parallel resonance of the Xtal. This has the effect of increasing the pullability range or frequency difference between the parallel resonance and series resonance of the Xtal. And, this has the ultimate effect of reducing the power consumption of the apparatus 200 for a given frequency or frequency range of the oscillating signal.

In particular, the apparatus 200 comprises a negative-resistance circuit 202, a Xtal 204, and a component 206 adapted to modify a series resonance of the Xtal 204 to decrease the power consumption of the negative-resistance circuit in generating the oscillating signal. The Xtal 204 and the component 206 are electrically coupled to each other to form a resonator. The resonator, in turn, is electrically coupled to the negative-resistance circuit 202 in a feedback manner in order to initiate and generate the oscillating signal. In this example, it is the component 206 that modifies the series resonance of the Xtal 204 in order to increase the pullability of the resonator, and thus, decrease the power consumption of the apparatus 200 for a given frequency or frequency range of the oscillating signal, as further explained below.

Figure 2B:
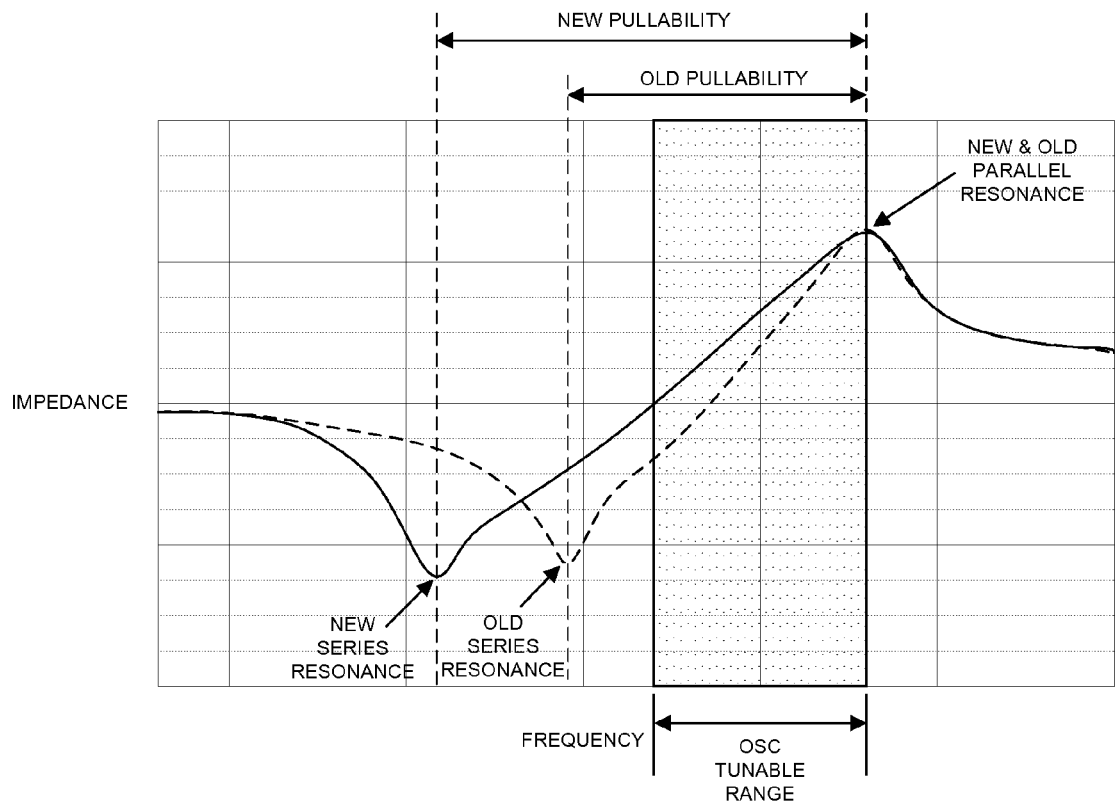
FIG. 2B illustrates a graph of an impedance versus frequency response (solid line) of the resonator of the exemplary apparatus in accordance with another aspect of the disclosure, and the corresponding response (dashed line) of the conventional apparatus.

FIG. 2B illustrates a graph of an impedance versus frequency response (solid line) of the resonator of the exemplary apparatus 200, and the corresponding response (dashed line) of the conventional apparatus 100. As previously discussed, the addition of the component 206 has the effect of lowering the series resonance of the Xtal 204, but does not significantly affect the parallel resonance of the Xtal. Thus, as noted in the graph, the "new series resonance" of the Xtal 204 of the apparatus 200 is substantially less than the "old series resonance" of the Xtal 104 of the conventional apparatus 100. Whereas, the "new parallel resonance" of the Xtal 204 of the apparatus 200 is substantially the same as the "old parallel resonance" of the Xtal 104 of the conventional apparatus 100, as noted in the graph.

Thus, by adding the component 206, the "new pullability" associated with the apparatus 200 is substantially greater than the "old pullability" associated with the conventional apparatus 100. As a result, the net impedance of the resonator of apparatus 200 is greater than the net impedance of the resonator of the apparatus 100, over the oscillator tunable range as indicated in the graph. Since power consumption is inversely related to the impedance of the resonator, the apparatus 200 consumes less power than the conventional apparatus 100 for a given frequency or frequency range of the oscillating signal. As the graph illustrates, the power consumption saving improves as the frequency of the oscillating signal is tuned closer to the series resonance.

Figure 2C:
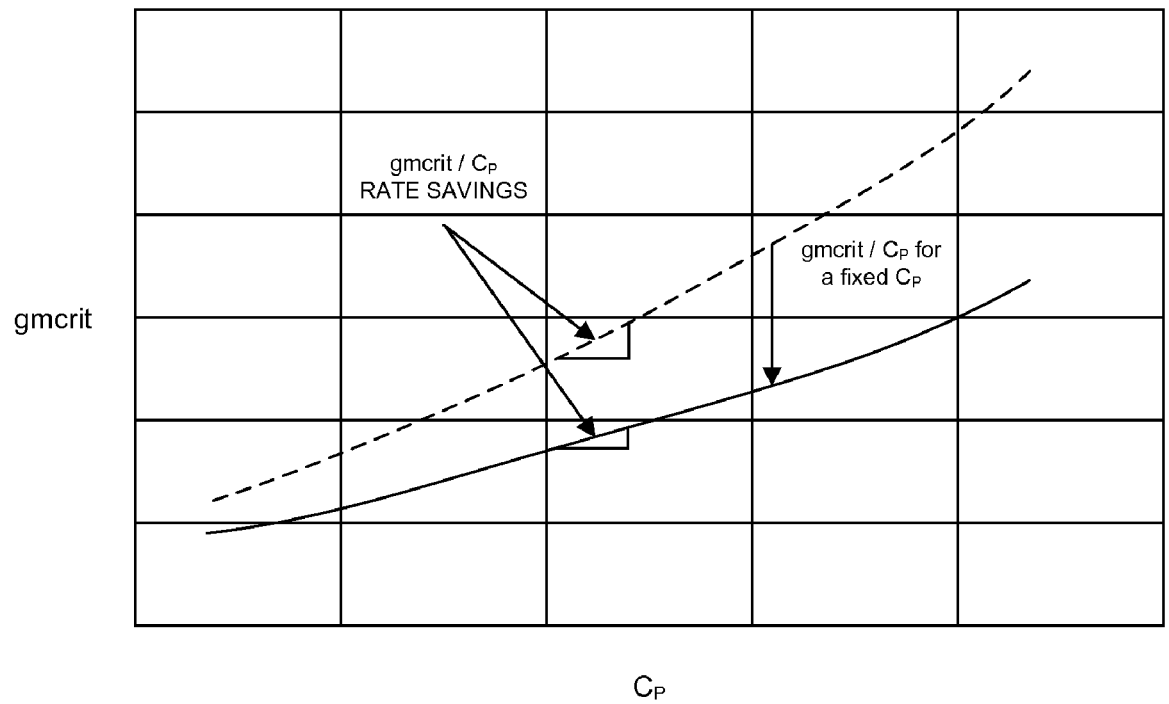
FIG. 2C illustrates a graph of a critical transconductance (gmcrit) versus Pierce capacitance ($C_P$) response (solid line) of the resonator of the exemplary apparatus in accordance with another aspect of the disclosure, and the corresponding response (dashed line) of the resonator of the conventional apparatus.

FIG. 2C illustrates a graph of a critical transconductance (gmcrit) versus Pierce capacitance ($C_P$) response (solid line) of the resonator of the exemplary apparatus 200, and the corresponding response (dashed line) of the resonator of the conventional apparatus 100. The critical transconductance gmcrit is substantially the minimum transconductance of the negative-resistance circuit required for the apparatus to generate the oscillating signal. The critical transconductance gmcrit is directly (non-inversely) related to the power consumption of the apparatus.

As the graph illustrates, the gmcrit v. $C_P$ response for the apparatus 200 is substantially lower than the corresponding response for the conventional apparatus 100. Thus, for a given capacitance $C_P$ of the one or more Pierce capacitors, the apparatus 200 consumes substantially less power than the conventional apparatus 100. Additionally, the slope of the gmcrit v. $C_P$ response for the apparatus 200 is substantially lower than the slope of the corresponding response for the conventional apparatus 100. Thus, to achieve a given oscillation frequency tuning range, a lower range of Pierce capacitance $C_P$ variation is achieved with the apparatus 200 as compared to that of the conventional apparatus 100. The following describes several exemplary distinct implementations of these concepts as described herein.

Figure 2D:
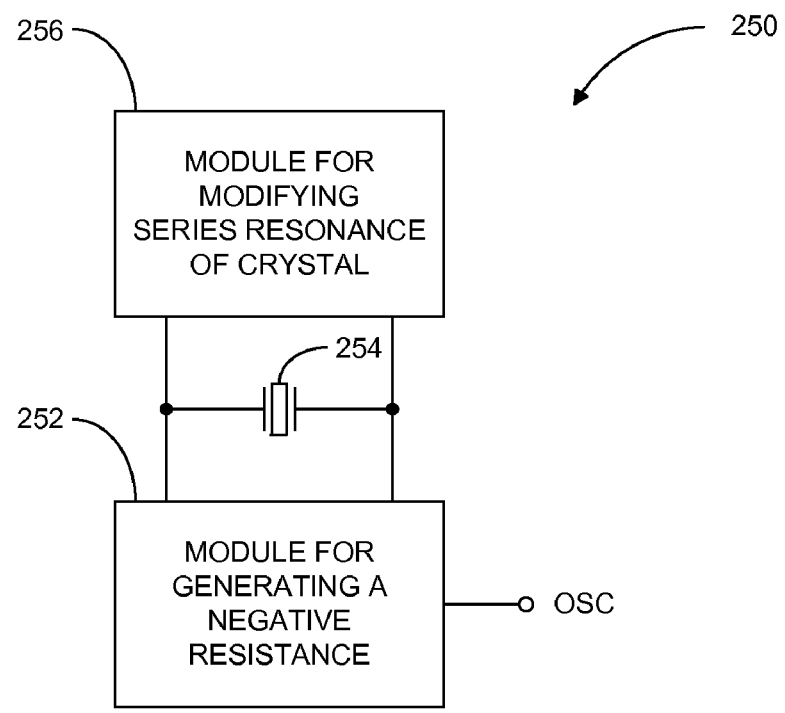
FIG. 2D illustrates a block/schematic diagram of an exemplary apparatus for generating an oscillating signal in accordance with an aspect of the disclosure.

FIG. 2D illustrates a block/schematic diagram of an exemplary apparatus 250 for generating an oscillating signal in accordance with an aspect of the disclosure. In general, the apparatus 250 comprises a module 252 for generating a negative resistance, a Xtal 254, and a module 256 for modifying the series resonance of the Xtal 254. More specifically, the module 256 lowers the series resonance of the Xtal, without significantly affecting the parallel resonance of the Xtal. This has the effect of increasing the pullability range or frequency difference between the parallel resonance and series resonance of the Xtal. And, this has the ultimate effect of reducing the power consumption of the apparatus 250 for a given frequency or frequency range of the oscillating signal.

Figure 3A:
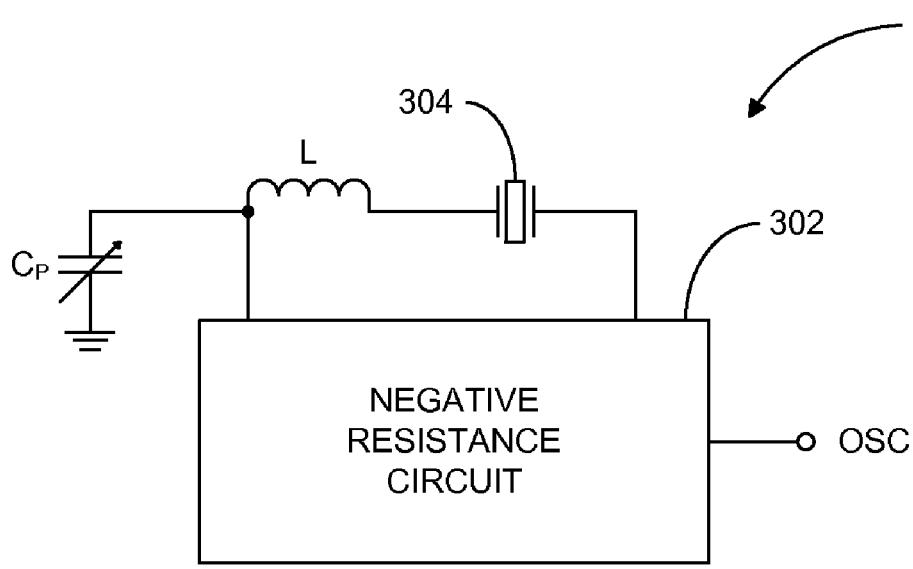
FIG. 3A illustrates a block/schematic diagram of another exemplary apparatus for generating an oscillating signal in accordance with another aspect of the disclosure.

FIG. 3A illustrates a block/schematic diagram of another exemplary apparatus 300 for generating an oscillating signal in accordance with another aspect of the disclosure. In summary, the apparatus 300 employs an inductive element as the component adapted to modify a series resonance of a Xtal for the purpose of decreasing the power consumption of the negative-resistance circuit in generating the oscillating signal.

In particular, the apparatus 300 comprises a negative-resistance circuit 302, a Xtal 304, a variable capacitor $C_P$, and an inductive element L (e.g., an inductor). The Xtal 304 is electrically coupled in series with the inductive element L, and the variable capacitor $C_P$ is electrically coupled between the inductive element L and ground. All of these elements (Xtal, L, and $C_P$) collectively form a resonator. The resonator, in turn, is electrically coupled to the negative-resistance circuit 302 in a feedback manner in order to initiate and generate the oscillating signal. In this example, the inductive element L modifies the series resonance of the Xtal 304 in order to increase the pullability of the resonator, and thus, decrease the power consumption of the apparatus 300 for a given frequency or frequency range of the oscillating signal, as previously discussed.

Figure 3B:
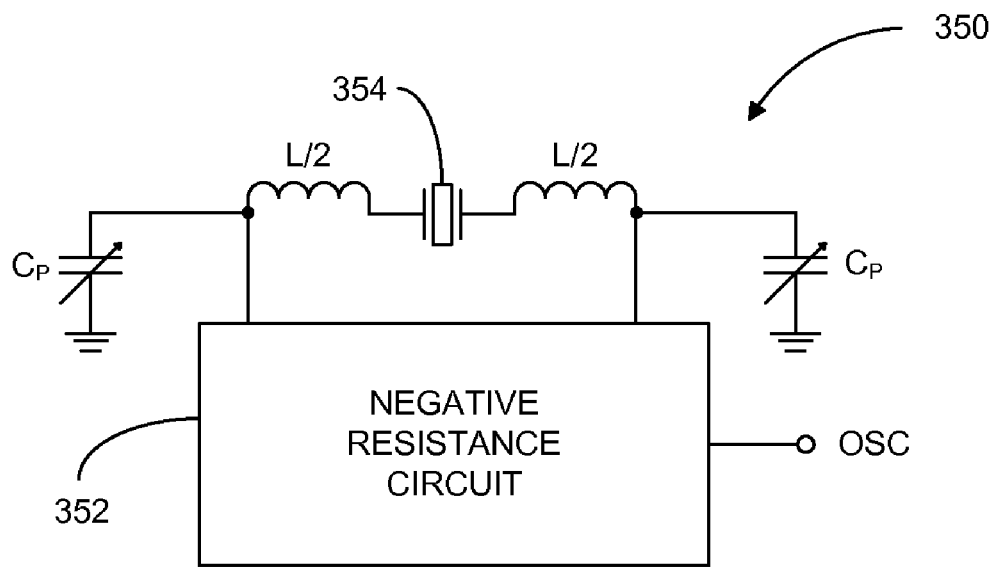
FIG. 3B illustrates a block/schematic diagram of another exemplary apparatus for generating an oscillating signal in accordance with another aspect of the disclosure.

FIG. 3B illustrates a block/schematic diagram of another exemplary apparatus 350 for generating an oscillating signal in accordance with another aspect of the disclosure. In summary, the apparatus 350 employs a pair of inductive elements for modifying a series resonance of a Xtal for the purpose of decreasing the power consumption of the negative-resistance circuit in generating the oscillating signal.

In particular, the apparatus 300 comprises a negative-resistance circuit 352, a Xtal 354, a pair of variable capacitors $C_P$, and a pair of inductive elements L/2 (e.g., one or more inductors). The inductive elements L/2 are coupled respectively to both sides of the Xtal 354, and the variable capacitors $C_P$ are electrically coupled respectively between the inductive elements L/2 and ground. All of these elements (Xtal, L/2, and $C_P$) collectively form a resonator. The resonator, in turn, is electrically coupled to the negative-resistance circuit 352 in a feedback manner in order to initiate and generate the oscillating signal. In this example, the pair of inductive elements L/2 modify the series resonance of the Xtal 354 in order to increase the pullability of the resonator, and thus, decrease the power consumption of the apparatus 350 for a given frequency or frequency range of the oscillating signal, as previously discussed.

Figure 4A:
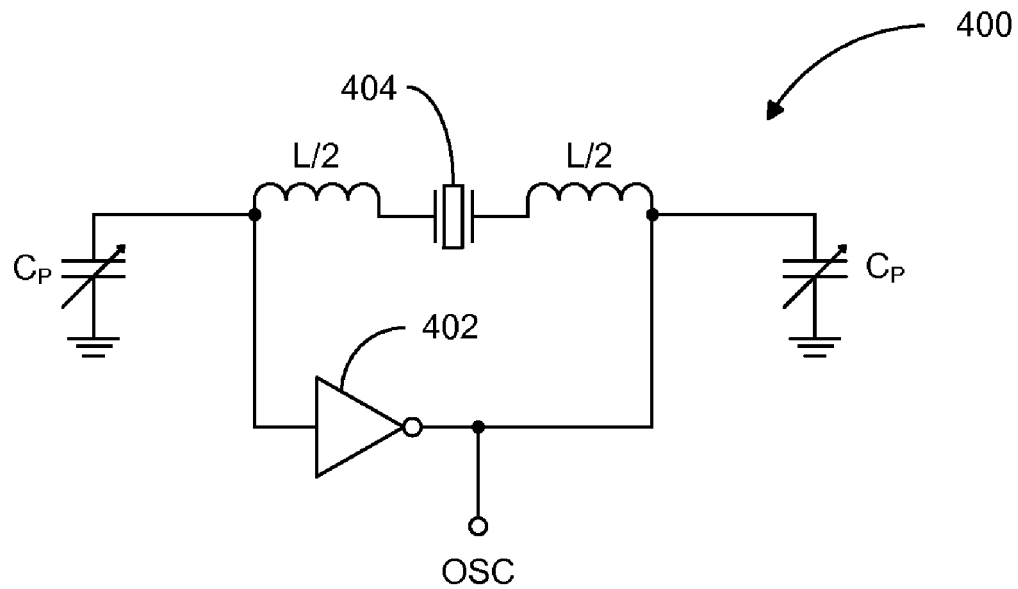
FIG. 4A illustrates a schematic diagram of another exemplary apparatus for generating an oscillating signal in accordance with another aspect of the disclosure.

FIG. 4A illustrates a schematic diagram of another exemplary apparatus 400 for generating an oscillating signal in accordance with another aspect of the disclosure. In summary, the apparatus 400 includes a negative-resistance circuit in the form of a digital inverter circuit and further employs a pair of inductive elements for modifying a series resonance of a Xtal for the purpose of decreasing the power consumption of the digital inverter circuit in generating the oscillating signal.

In particular, the apparatus 400 comprises a digital inverter circuit 402, a Xtal 404, a pair of variable capacitors $C_P$, and a pair of inductive elements L/2 (e.g., one or more inductors). The inductive elements L/2 are coupled respectively to both sides of the Xtal 404, and the variable capacitors $C_P$ are electrically coupled respectively between the inductive elements L/2 and ground. All of these elements (Xtal, L/2, $C_P$) collectively form a resonator. The resonator, in turn, is electrically coupled to the digital inverter circuit 402 in a feedback manner in order to initiate and generate the oscillating signal. In this example, the pair of inductive elements L/2 modify the series resonance of the Xtal 404 in order to increase the pullability of the resonator, and thus, decrease the power consumption of the apparatus 400 for a given frequency or frequency range of the oscillating signal, as previously discussed.

Figure 4B:
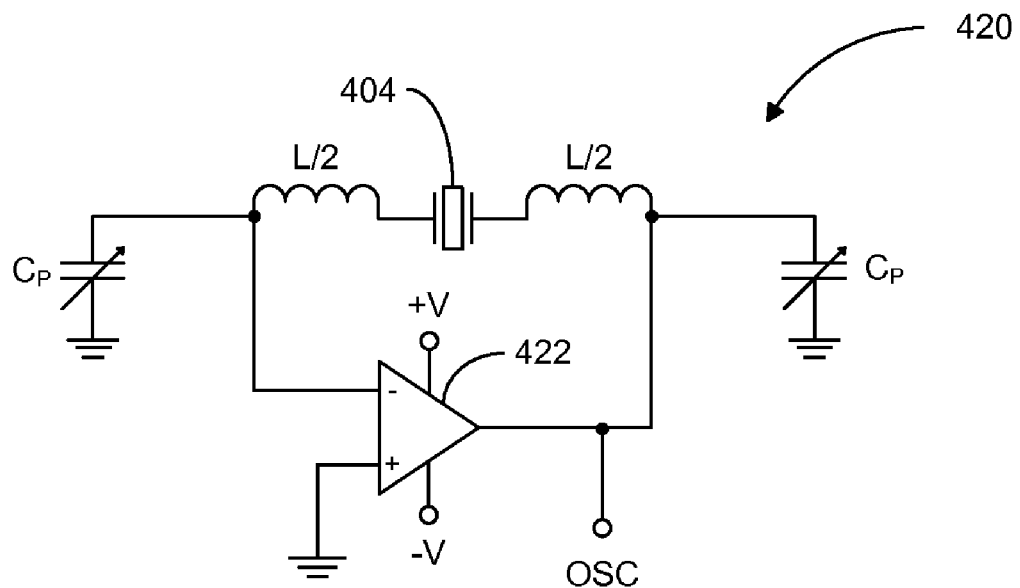
FIG. 4B illustrates a schematic diagram of another exemplary apparatus for generating an oscillating signal in accordance with another aspect of the disclosure.

FIG. 4B illustrates a schematic diagram of another exemplary apparatus 420 for generating an oscillating signal in accordance with another aspect of the disclosure. In summary, the apparatus 420 includes a negative-resistance circuit in the form of an inverting analog amplifier and further employs a pair of inductive elements for modifying a series resonance of a Xtal for the purpose of decreasing the power consumption of the inverting analog amplifier in generating the oscillating signal.

In particular, the apparatus 420 comprises an inverting analog amplifier 422, a Xtal 404, a pair of variable capacitors $C_P$, and a pair of inductive elements L/2 (e.g., one or more inductors). The inductive elements L/2 are coupled respectively to both sides of the Xtal 404, and the variable capacitors $C_P$ are electrically coupled respectively between the inductive elements L/2 and ground. All of these elements (Xtal, L/2, $C_P$) collectively form a resonator. The resonator, in turn, is electrically coupled to the output and inverting input of the inverting analog amplifier 422 in order to initiate and generate the oscillating signal. The non-inverting input of the amplifier 422 may be connected to ground. The amplifier 422 may receive power from a positive (+V) and negative (−V) power supply voltage. In this example, the pair of inductive elements L/2 modify the series resonance of the Xtal 404 in order to increase the pullability of the resonator, and thus, decrease the power consumption of the apparatus 420 for a given frequency or frequency range of the oscillating signal, as previously discussed.

Figure 4C:
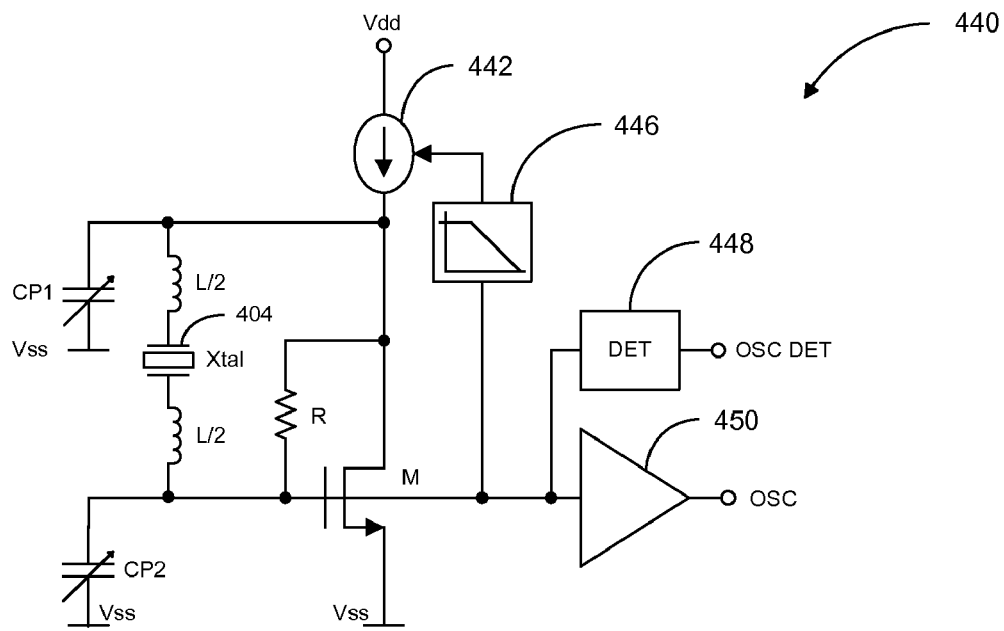
FIG. 4C illustrates a schematic diagram of another exemplary apparatus for generating an oscillating signal in accordance with another aspect of the disclosure.

FIG. 4C illustrates a schematic diagram of another exemplary apparatus 440 for generating an oscillating signal in accordance with another aspect of the disclosure. In summary, the apparatus 440 includes a negative-resistance circuit in the form of a self-regulating circuit and further employs a pair of inductive elements for modifying a series resonance of a Xtal for the purpose of decreasing the power consumption of the self-regulating circuit in generating the oscillating signal.

In particular, the apparatus 440 comprises a resonator including a Xtal 404, a pair of variable capacitors $C_P$, and a pair of inductive elements L/2 (e.g., one or more inductors). The inductive elements L/2 are coupled respectively to both sides of the Xtal 404, and the variable capacitors $C_P$ are electrically coupled respectively between the inductive elements L/2 and ground. The resonator, in turn, is electrically coupled to the self-regulating circuit in a feedback configuration in order to initiate and generate the oscillating signal.

The self-regulating circuit, in turn, comprises an active device M (e.g., a metal oxide semiconductor field effect transistor (MOSFET)), a resistor R, a current mirror 442, and a low pass filter (LPF) 446. The current mirror 442 is electrically coupled between a power supply rail Vdd and the drain of the active device M. The resistor R is electrically coupled between the drain and gate of the active device M, which has a source connected to a negative power supply rail Vss. The LPF 446 is electrically coupled between the gate of the active device M and the current mirror M. The self-regulation circuit regulates the current supplied to the active device M in response to the amplitude of the oscillating signal at the gate of the active device M.

More specifically, the resonator is coupled between the drain and gate of the active device M. In this example, the pair of inductive elements L/2 modify the series resonance of the Xtal 404 in order to increase the pullability of the resonator, and thus, decrease the power consumption of the apparatus 440 for a given frequency or frequency range of the oscillating signal, as previously discussed. The apparatus 440 further includes an oscillation detector 448 adapted to generate a signal indicative of whether the oscillating signal is being generated. Additionally, the apparatus 440 includes an amplifier 450 adapted to amplify the oscillating signal.

Figure 4D:
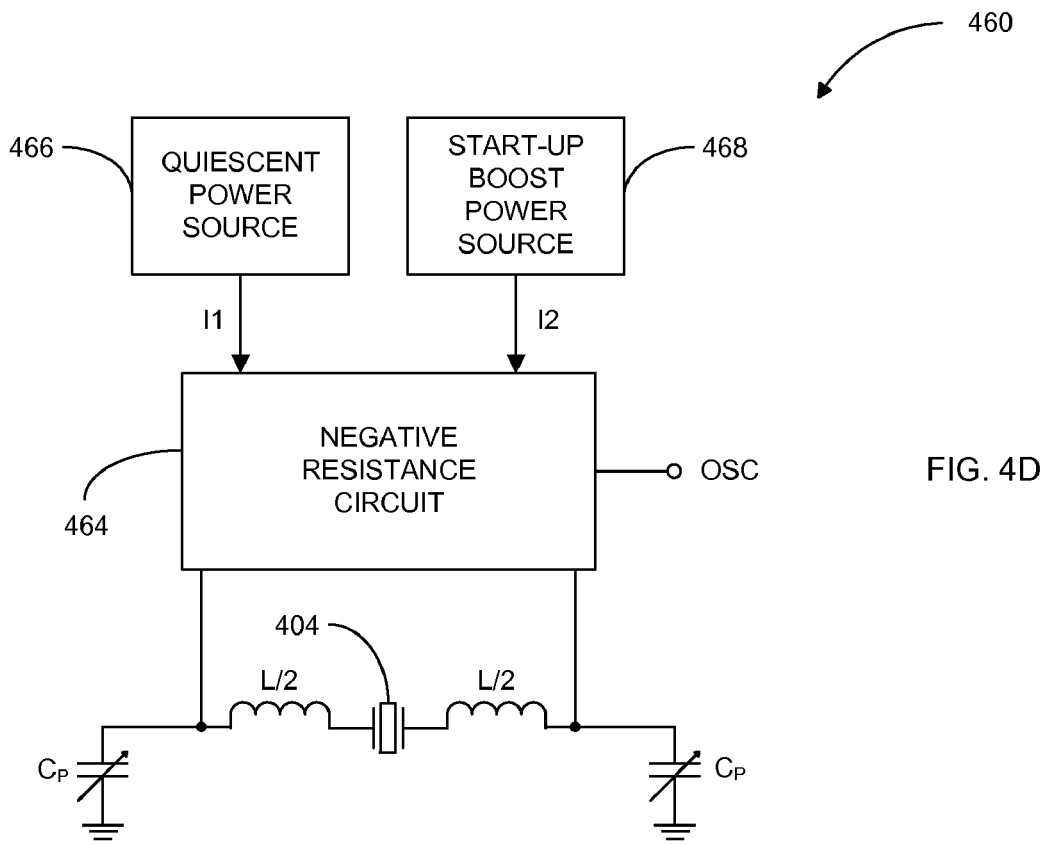
FIG. 4D illustrates a block/schematic diagram of another exemplary apparatus for generating an oscillating signal in accordance with another aspect of the disclosure.

FIG. 4D illustrates a block/schematic diagram of another exemplary apparatus 460 for generating an oscillating signal in accordance with another aspect of the disclosure. In summary, the apparatus 460 includes a quiescent power source adapted to supply a substantially steady-state current to a negative-resistance circuit for continued generation of the oscillating signal, and a start-up boost power source for supplying a boost current only during start up in order to expedite the oscillating signal reaching a defined steady-state condition. Additionally, the apparatus 460 includes a pair of inductive elements for modifying a series resonance of a Xtal for the purpose of decreasing the power consumption of the negative-resistance circuit in generating the oscillating signal.

In particular, the apparatus 460 comprises a quiescent power source 466, a start-up boost power source 468, a negative-resistance circuit 464, a Xtal 404, a pair of variable capacitors $C_P$, and a pair of inductive elements L/2 (e.g., one or more inductors). The inductive elements L/2 are coupled respectively to both sides of the Xtal 404, and the variable capacitors $C_P$ are electrically coupled respectively between the inductive elements L/2 and ground. All of these elements (Xtal, L/2, and $C_P$) collectively form a resonator. The resonator, in turn, is electrically coupled to the negative-resistance circuit 464 in a feedback configuration in order to initiate and generate the oscillating signal. In this example, the pair of inductive elements L/2 modify the series resonance of the Xtal 404 in order to increase the pullability of the resonator, and thus, decrease the power consumption of the apparatus 460 for a given frequency or frequency range of the oscillating signal, as previously discussed.

The quiescent power source 466 is adapted to supply a substantially steady-state current I1 to the negative-resistance circuit 464 in order for the latter to continuously generate the oscillating signal. The start-up boost power source 468 is adapted to supply a boost current I2 only during start up in order to expedite the oscillating signal in reaching a defined steady-state condition from a cold start. The steady-state condition may be a defined amplitude stability and/or a defined frequency stability.

Figure 5:
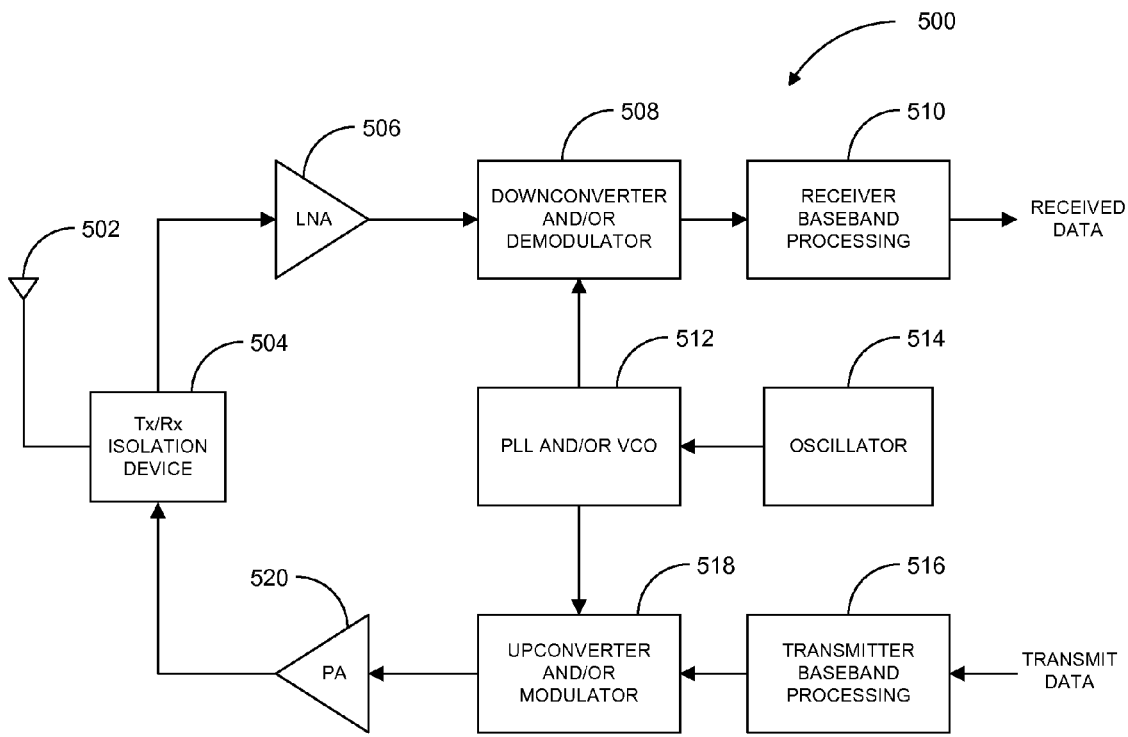
FIG. 5 illustrates a block diagram of an exemplary communication system in accordance with another aspect of the disclosure.

FIG. 5 illustrates a block diagram of an exemplary communication device 500 in accordance with another aspect of the disclosure. The communication device 500 may be one exemplary implementation of a communication device that uses any of the apparatuses previously discussed as a reference oscillator. In particular, the communications device 500 comprises an antenna 502, a Tx/Rx isolation device 504, a low noise amplifier (LNA) 506, a downconverter and/or demodulator 508, a receiver baseband processing module 510, a phase locked loop (PLL) and/or voltage controlled oscillator (VCO) 512, a reference oscillator 514, a transmitter baseband processing module 516, an upconverter and/or modulator 518, and a power amplifier (PA) 520.

As a source communication device, data to be transmitted to a destination communication device is sent to the transmitter baseband processing module 516. The transmitter baseband processing module 516 processes the transmit data to generate an outgoing baseband signal. The upconverter and/or modulator 518, using a local oscillator or signal generated by the PLL and/or VCO 512 with the use of the reference oscillator 514, processes the outgoing baseband signal to generate an RF signal. The PA 520 amplifies the RF signal and provides it to the antenna 502 via the Tx/Rx isolation device 504 for transmission into a wireless medium. The transmit data may be generated by a sensor, a microprocessor, a microcontroller, a RISC processor, a keyboard, a pointing device such as a mouse or a track ball, an audio device, such as a headset, including a transducer such as a microphone, a medical device, a shoe, a robotic or mechanical device that generates data, a user interface, such as a touch-sensitive display, etc. It shall be understood that the reference oscillator 514 may be used in other types of application, such as a clock source to drive digital and/or analog circuitry.

As a destination communication device, an RF signal carrying data is picked up by the antenna 502 and applied to the LNA 506 via the Tx/Rx isolation device 504. The LNA 506 amplifies the received RF signal. The downconverter and/or demodulator 508, using a local oscillator or signal generated by the PLL and/or VCO 512 with the use of the reference oscillator 514, processes the received RF signal to generate incoming baseband signal. The receiver baseband processing 510 processes the incoming baseband signal to generate the received data. A data processor (not shown) may then perform one or more defined operations based on the received data. For example, the data processor may include a microprocessor, a microcontroller, a reduced instruction set computer (RISC) processor, a display, an audio device, such as a headset, including a transducer such as speakers, a medical device, a shoe, a watch, a robotic or mechanical device responsive to the data, a user interface, such as a display, one or more light emitting diodes (LED), etc.

Figure 6A:
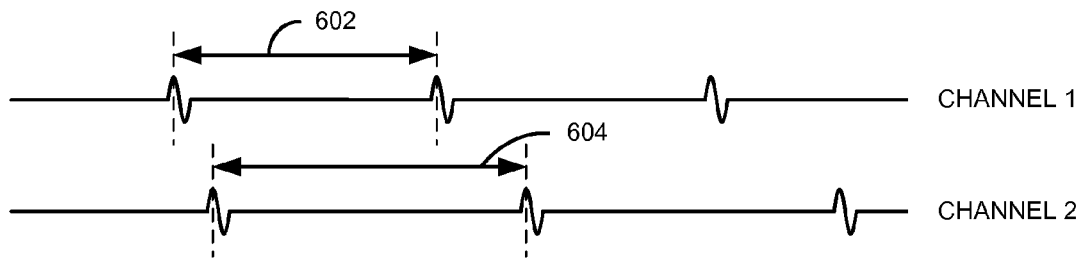
FIGS. 6A-D illustrate timing diagrams of various pulse modulation techniques in accordance with another aspect of the disclosure.

FIG. 6A illustrates different channels (channels 1 and 2) defined with different pulse repetition frequencies (PRF) as an example of a pulse modulation that may be employed in any of the communications systems, devices, and apparatuses described herein. Specifically, pulses for channel 1 have a pulse repetition frequency (PRF) corresponding to a pulse-to-pulse delay period 602. Conversely, pulses for channel 2 have a pulse repetition frequency (PRF) corresponding to a pulse-to-pulse delay period 604. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF)). Conversely, a channel supporting relatively high data rates (e.g., on the order of a several megabits per second or Mbps) may employ a correspondingly higher pulse repetition frequency (PRF).

Figure 6B:
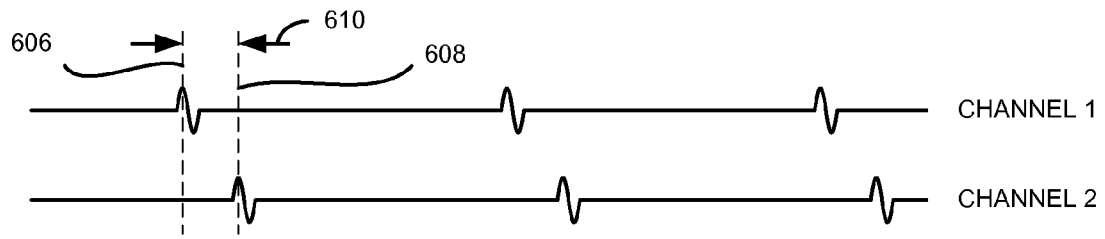

FIG. 6B illustrates different channels (channels 1 and 2) defined with different pulse positions or offsets as an example of a modulation that may be employed in any of the communications systems described herein. Pulses for channel 1 are generated at a point in time as represented by line 606 in accordance with a first pulse offset (e.g., with respect to a given point in time, not shown). Conversely, pulses for channel 2 are generated at a point in time as represented by line 608 in accordance with a second pulse offset. Given the pulse offset difference between the pulses (as represented by the arrows 610), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels.

Figure 6C:
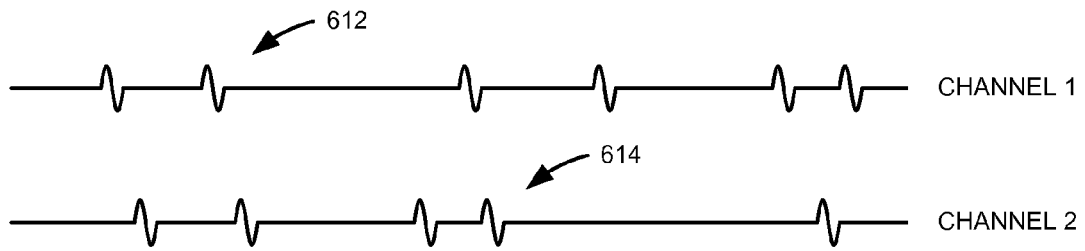

FIG. 6C illustrates different channels (channels 1 and 2) defined with different timing hopping sequences modulation that may be employed in any of the communications systems described herein. For example, pulses 612 for channel 1 may be generated at times in accordance with one time hopping sequence while pulses 614 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels.

Figure 6D:
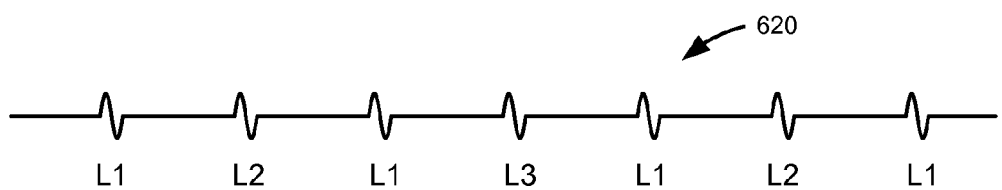

FIG. 6D illustrates different channels defined with different time slots as an example of a pulse modulation that may be employed in any of the communications systems described herein. Pulses for channel L1 are generated at particular time instances. Similarly, pulses for channel L2 are generated at other time instances. In the same manner, pulse for channel L3 are generated at still other time instances. Generally, the time instances pertaining to the different channels do not coincide or may be orthogonal to reduce or eliminate interference between the various channels.

It should be appreciated that other techniques may be used to define channels in accordance with a pulse modulation schemes. For example, a channel may be defined based on different spreading pseudo-random number sequences, or some other suitable parameter or parameters. Moreover, a channel may be defined based on a combination of two or more parameters.

Figure 7:
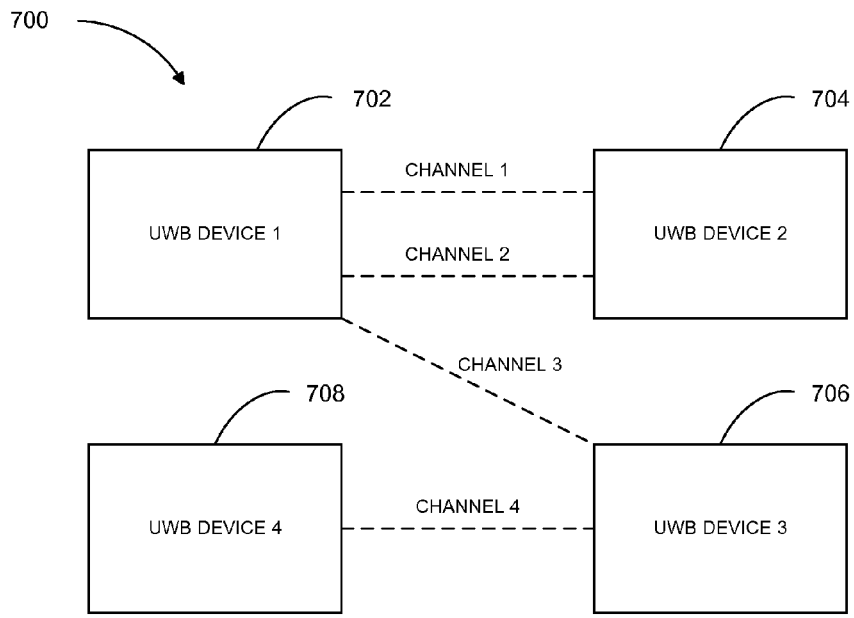
FIG. 7 illustrates a block diagram of various communications devices communicating with each other via various channels in accordance with another aspect of the disclosure.

FIG. 7 illustrates a block diagram of various ultra-wide band (UWB) communications devices communicating with each other via various channels in accordance with another aspect of the disclosure. For example, UWB device 1 702 is communicating with UWB device 2 704 via two concurrent UWB channels 1 and 2. UWB device 702 is communicating with UWB device 3 706 via a single channel 3. And, UWB device 3 706 is, in turn, communicating with UWB device 4 708 via a single channel 4. Other configurations are possible. The communications devices may be used for many different applications, and may be implemented, for example, in a headset, microphone, biometric sensor, heart rate monitor, pedometer, EKG device, watch, shoe, remote control, switch, tire pressure monitor, or other communications devices. A medical device may include smart band-aid, sensors, vital sign monitors, and others. The communications devices described herein may be used in any type of sensing application, such as for sensing automotive, athletic, and physiological (medical) responses.

Any of the above aspects of the disclosure may be implemented in many different devices. For example, in addition to medical applications as discussed above, the aspects of the disclosure may be applied to health and fitness applications. Additionally, the aspects of the disclosure may be implemented in shoes for different types of applications. There are other multitude of applications that may incorporate any aspect of the disclosure as described herein.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus for generating a steady-state oscillating signal, comprising:
    a negative-resistance circuit;
    a crystal;
    a component adapted to modify a series resonance of the crystal to decrease a power consumption of the negative-resistance circuit in generating the steady-state oscillating signal; and
    a frequency-tuning component adapted to set a frequency of the steady-state oscillating signal between the series resonance and a parallel resonance of the crystal.

2. The apparatus of claim 1, wherein the component comprises a positive-reactance circuit.

3. The apparatus of claim 1, wherein the component comprises one or more inductive elements.

4. The apparatus of claim 1, wherein the component comprises a pair of inductive elements coupled to respectively on both sides of the crystal.

5. The apparatus of claim 1, wherein the frequency-tuning component is adapted to adjust the frequency of the steady-state oscillating signal to be within ±10 ppm of a defined frequency.

6. The apparatus of claim 1, wherein the frequency-tuning component comprises one or more variable capacitive elements coupled to the crystal.

7. The apparatus of claim 6, wherein the negative-resistance circuit is configured to consume less current for a given capacitance of the one or more variable capacitive elements.

8. The apparatus of claim 6, wherein the negative-resistance circuit is configured to consume less power for a given capacitance of the one or more variable capacitive elements.

9. The apparatus of claim 1, wherein the negative-resistance circuit comprises a digital inverter circuit, an inverting analog amplifier, or a self-regulating circuit.

10. The apparatus of claim 1, further comprising:
    a quiescent current source adapted to supply a steady-state current to the negative resistance circuit; and
    a start-up boost current source adapted to supply a boost current to the negative-resistance circuit only during an initiation of the oscillating signal to speed up the oscillating signal in reaching the steady-state condition.

11. A method for generating a steady-state oscillating signal, comprising:
    generating the oscillating signal using a negative resistance and a crystal;
    modifying a series resonance of the crystal to decrease a power consumption used in generating the steady-state oscillating signal; and
    adjusting a frequency of the steady-state oscillating signal between the series resonance and a parallel resonance of the crystal.

12. The method of claim 11, wherein modifying the series resonance of the crystal comprises adding a positive-reactance to the crystal.

13. The method of claim 11, wherein modifying the series resonance of the crystal comprises coupling one or more inductive element to the crystal.

14. The method of claim 11, wherein modifying the series resonance of the crystal comprises coupling a pair of inductive elements respectively on both sides of the crystal.

15. The method of claim 11, wherein adjusting the frequency of the steady-state oscillating signal comprises adjusting the frequency of the steady-state oscillating signal to be within ±10 ppm of a defined frequency.

16. The method of claim 11, wherein adjusting the frequency of the steady-state oscillating signal comprises adjusting one or more variable capacitive elements coupled to the crystal.

17. The method of claim 16, further comprising configuring the negative-resistance to consume less current for a given capacitance of the one or more variable capacitive elements.

18. The method of claim 16, further comprising configuring the negative-resistance to consume less power for a given capacitance of the one or more variable capacitive elements.

19. The method of claim 11, wherein generating the negative-resistance comprises using a digital inverter circuit, an inverting analog amplifier, or a self-regulating circuit.

20. The method of claim 11, further comprising:
supplying a steady-state current to generate the negative resistance; and
supplying a start-up boost current only to initiate the oscillating signal to speed up the oscillating signal in reaching the steady-state condition.

21. A apparatus for generating a steady-state oscillating signal, comprising:
means for generating a negative resistance;
means for coupling a crystal to the negative resistance generating means to generate the steady-state oscillating signal cycling with a defined frequency;
means for modifying a series resonance of the crystal to decrease a power consumption used to generate the steady-state oscillating signal; and
means for setting a frequency of the oscillating signal between the series resonance and a parallel resonance of the crystal.

22. The apparatus of claim 21, wherein the series resonance modifying means comprises a positive-reactance circuit.

23. The apparatus of claim 21, wherein the series resonance modifying means comprises one or more inductive elements coupled to the crystal.

24. The apparatus of claim 21, wherein the series resonance modifying means comprises a pair of inductive elements coupled to respectively on both sides of the crystal.

25. The apparatus of claim 21, wherein the frequency adjusting means is adapted to adjust the frequency of the steady-state oscillating signal to be within ±10 ppm of a defined frequency.

26. The apparatus of claim 21, wherein the frequency adjusting means comprises one or more variable capacitive elements coupled to the crystal.

27. The apparatus of claim 26, wherein the negative resistance generating means is configured to consume less current for a given capacitance of the one or more variable capacitive elements.

28. The apparatus of claim 26, wherein the negative resistance generating means is configured to consume less power for a given capacitance of the one or more variable capacitive elements.

29. The apparatus of claim 21, wherein the negative resistance generating means comprises using a digital inverter circuit, an inverting analog amplifier, or a self-regulating circuit.

30. The apparatus of claim 21, further comprising:
means for supplying a steady-state current to the negative resistance generating means; and
means for supplying a start-up boost current to the negative resistance generating means only during an initiation of the oscillating signal to speed up the oscillating signal in reaching the steady-state condition.

31. A computer program product for generating a steady-state oscillating signal comprising:
a computer readable medium comprising instructions executable to:
generate the steady-state oscillating signal using a negative resistance coupled to a crystal;
modify a series resonance of the crystal to decrease a power consumption used to generate the negative-resistance; and
adjust a frequency of the steady-state oscillating signal between the series resonance and a parallel resonance of the crystal.

32. A headset, comprising:
a negative-resistance circuit;
a crystal;
a component adapted to modify a series resonance of the crystal to decrease a power consumption of the negative-resistance circuit in generating a steady-state oscillating signal;
a frequency-tuning component adapted to set a frequency of the steady-state oscillating signal between the series resonance and a parallel resonance of the crystal;
a transducer adapted to generate audio data; and
a transmitter adapted to transmit the audio data using the steady-state oscillating signal.

33. A watch, comprising:
a negative-resistance circuit;
a crystal;
a component adapted to modify a series resonance of the crystal to decrease a power consumption of the negative-resistance circuit in generating a steady-state oscillating signal;
a frequency-tuning component adapted to set a frequency of the steady-state oscillating signal between the series resonance and a parallel resonance of the crystal;
a receiver adapted to receive data using the steady-state oscillating signal; and
a user interface adapted to generate an indication based on the received data.

34. A sensing device, comprising:
a negative-resistance circuit;
a crystal; and
a component adapted to modify a series resonance of the crystal to decrease a power consumption of the negative-resistance circuit in generating a steady-state oscillating signal;
a frequency-tuning component adapted to set a frequency of the steady-state oscillating signal between the series resonance and a parallel resonance of the crystal;
a sensor adapted to generate sensed data; and
a transmitter adapted to transmit sensed data using the steady-state oscillating signal.

* * * * *